(12) United States Patent
Bishop

(10) Patent No.: US 6,427,024 B1
(45) Date of Patent: Jul. 30, 2002

(54) APPARATUS FOR AND METHOD OF AUTOMATIC OPTICAL INSPECTION OF ELECTRONIC CIRCUIT BOARDS, WAFERS AND THE LIKE FOR DEFECTS, USING SKELETAL REFERENCE INSPECTION AND SEPARATELY PROGRAMMABLE ALIGNMENT TOLERANCE AND DETECTION PARAMETERS

(75) Inventor: Robert Bishop, Newton, MA (US)

(73) Assignee: Beltronics, Inc., Newton, MA (US)

( * ) Notice: Subject to any disclaimer, the term of this patent is extended or adjusted under 35 U.S.C. 154(b) by 0 days.

(21) Appl. No.: 09/285,276

(22) Filed: Apr. 2, 1999

(51) Int. Cl.[7] .............................. G06K 9/00; G06K 9/56; G06K 9/42; H04N 7/18

(52) U.S. Cl. ...................... 382/149; 382/205; 382/259; 348/126

(58) Field of Search .................................. 382/141, 144, 382/145, 147, 148, 149, 150, 205, 217, 218, 257, 258, 259; 348/86, 87, 125, 126; 356/401, 430, 431; 438/16

(56) References Cited

U.S. PATENT DOCUMENTS

| | | | | |
|---|---|---|---|---|
| 5,119,434 A | * | 6/1992 | Bishop et al. | 382/147 |
| 5,237,626 A | * | 8/1993 | Forslund et al. | 382/256 |
| 5,485,532 A | * | 1/1996 | Ishihara | 382/205 |
| 5,524,152 A | * | 6/1996 | Bishop et al. | 382/165 |
| 5,659,630 A | * | 8/1997 | Forslund | 382/149 |
| 5,787,191 A | * | 7/1998 | Kawamura et al. | 382/149 |
| 6,128,404 A | * | 10/2000 | LeBeau | 382/141 |

* cited by examiner

Primary Examiner—Amelia M. Au
Assistant Examiner—Mehrdad Dastouri
(74) Attorney, Agent, or Firm—Rines and Rines

(57) ABSTRACT

A novel wafer or circuit board automatic scanning optical inspection system and technique using the reference comparison principle for finding defects in scanned sample images, that enables a new degree of universality in finding all defects including very small single pixel conductor breaks and shorts and defects of irregular shapes, and together with simultaneous design rule processing, through the use of processed skeletal reference images and with separately programmable alignment tolerance and detection parameters.

47 Claims, 13 Drawing Sheets

Block Diagram for Full Inspection

Comparison of Reference and Sample Images

Element-Wise Comparison of Reference and Sample Images
(Note: Shaded areas represent Elements.)

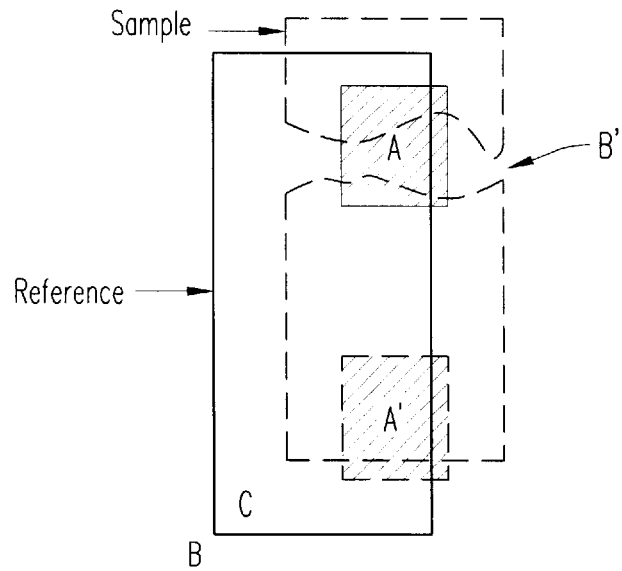
Sample with Small Break Compared to Reference
FIG. 3
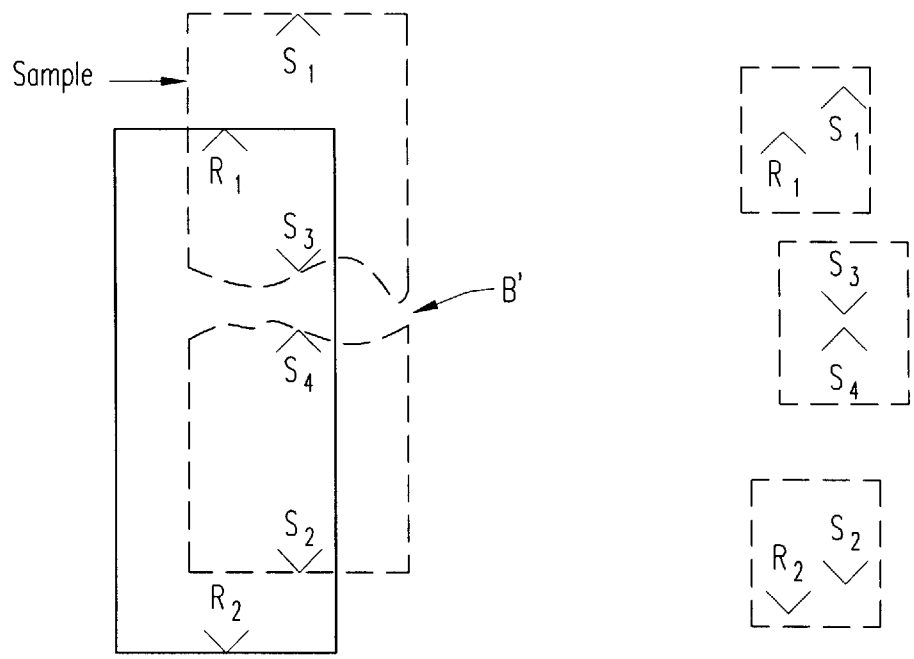
FIG. 4a
FIG. 4b
FIG. 4a-b: End-Wise Comparison to Reference of Sample with Small Break

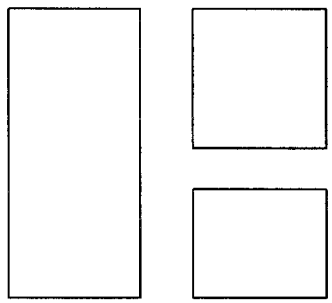
Reference Part
FIG. 5a
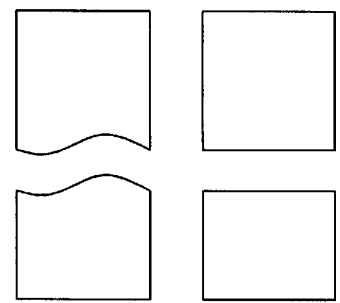
Sample Part
FIG. 5c
$\hat{R_1}$    $\hat{R_3}$
$R_4$ ⌄
$\hat{R_5}$
$R_2$ ⌄    $R_6$ ⌄
Reference Ends
FIG. 5b
$\hat{S_1}$    $\hat{S_3}$
$S_7$ ⌄    $S_4$ ⌄
$\hat{S_8}$    $\hat{S_5}$
$S_2$ ⌄    $S_6$ ⌄
Sample Ends
FIG. 5d
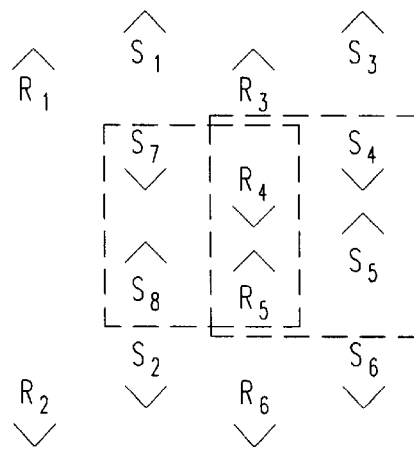
Comparison of Ends
FIG. 5e
FIG. 5a–e: Failure of End-Wise Comparison Method

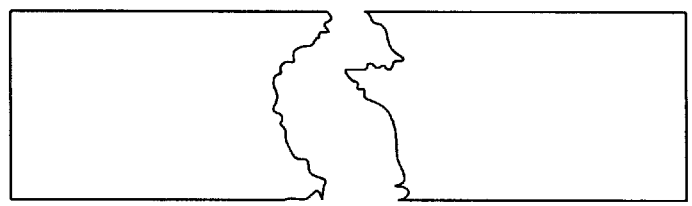
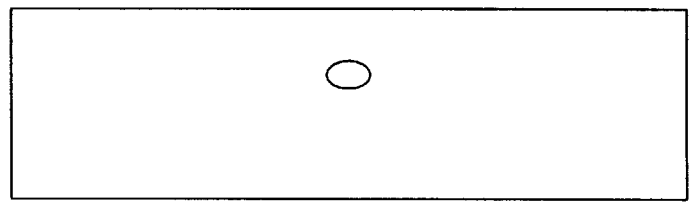
FIG. 6: Irregular Defects
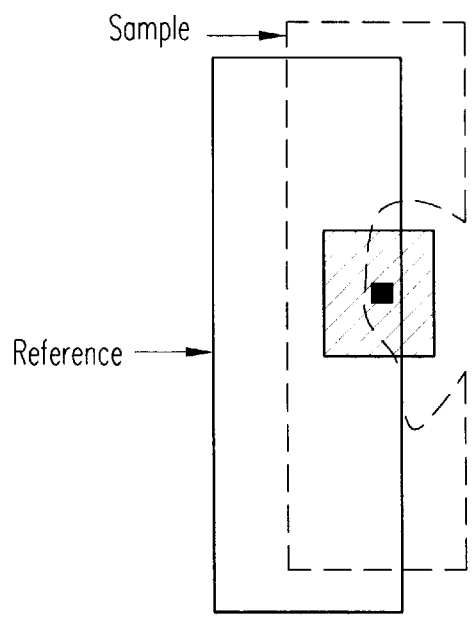
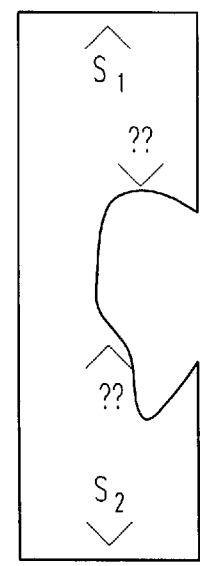
FIG. 7a      FIG. 7b
FIG. 7a-b: Reference Comparison of "Mousebite"

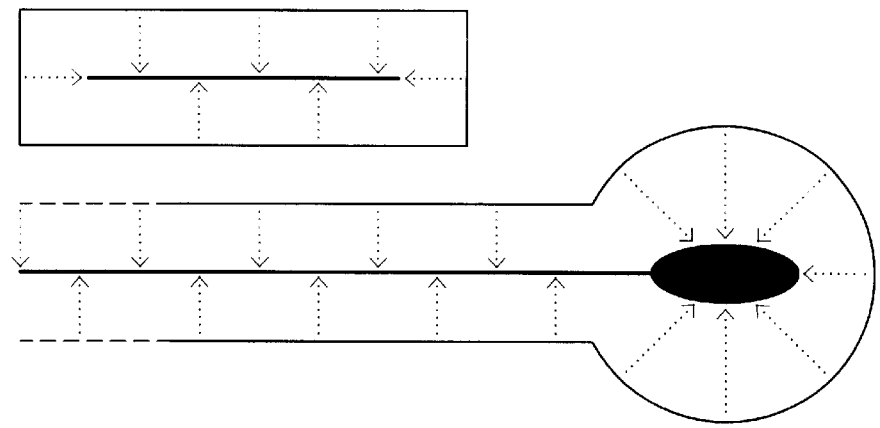
Single-Pixel Width Reference Image with Ends
Reasonably Thinned
FIG. 8
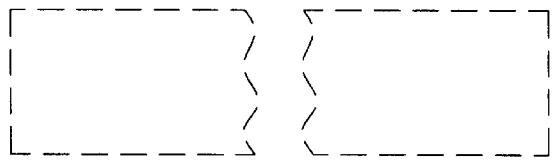
FIG. 9a Original Image
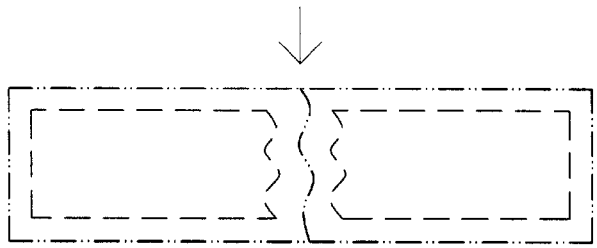
FIG. 9b Expanded Image
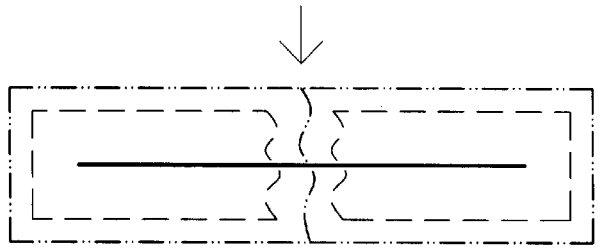
FIG. 9c Skeleton of Expanded Image
FIG. 9a-c Sealing Small Breaks in Reference Image FIG. 10a-b: Comparison of Thinned Reference Image and Sample Image

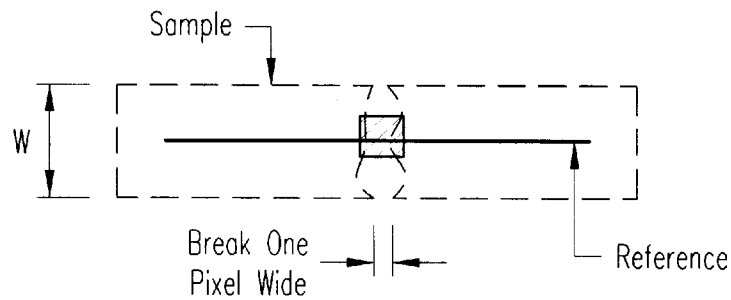
FIG. 11: Failure of Thinned Reference Comparison to find Very Small Break
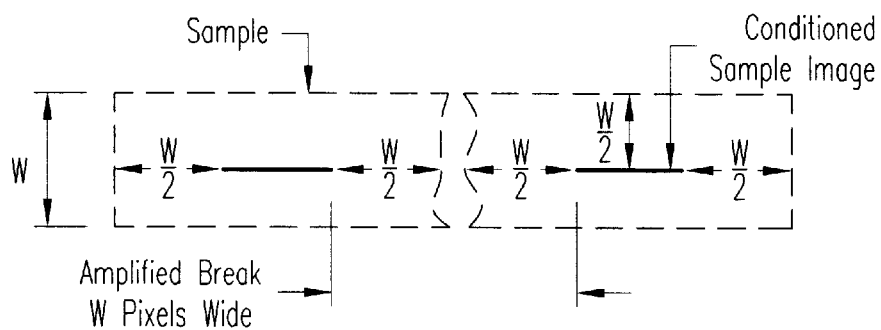
FIG. 12: Sample Image Shrunk by W Pixels
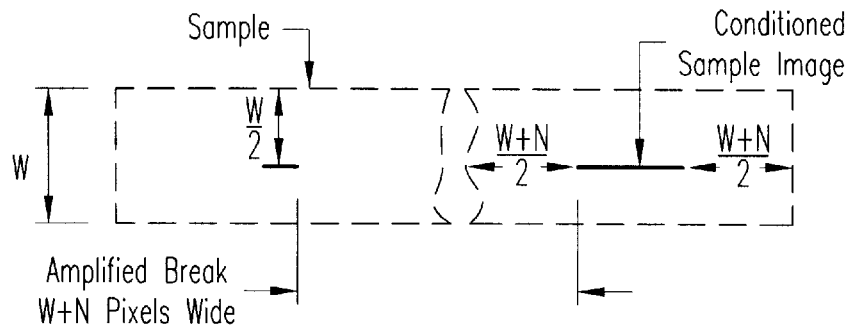
FIG. 13: Sample Image Shrunk by W+N Pixels

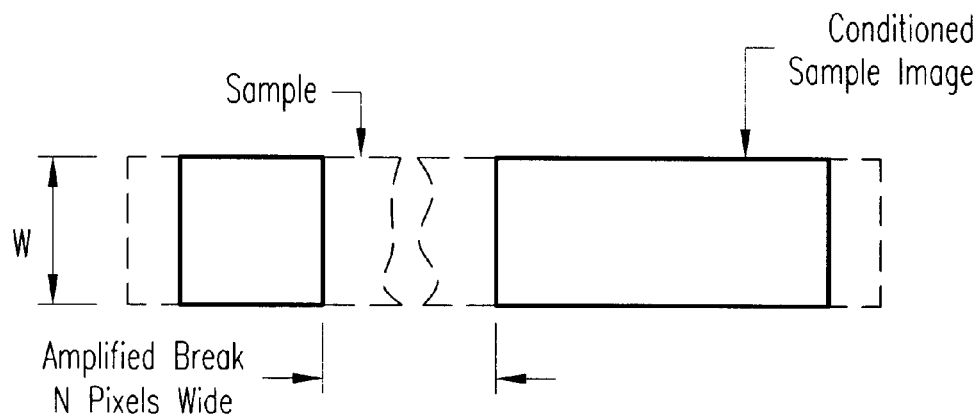
FIG. 14: Sample Image After W+N Shrink Functions and W Expand Functions
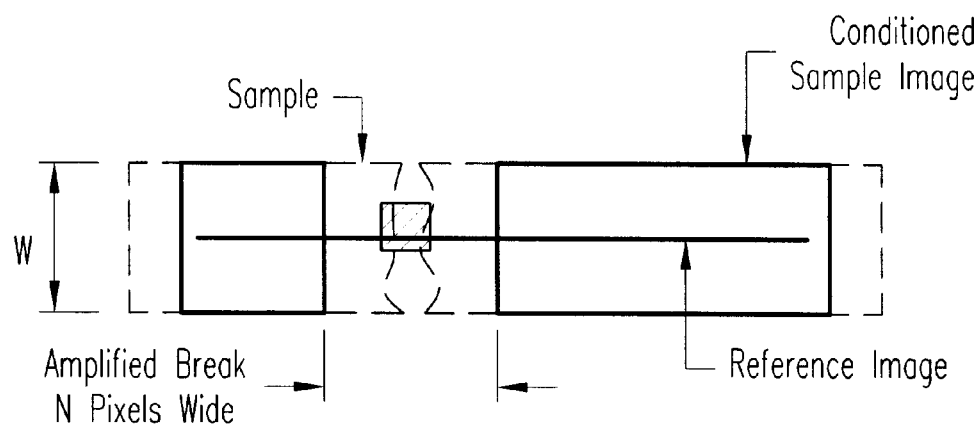
FIG. 15: Comparison of Thinned Reference and Processed Sample Images

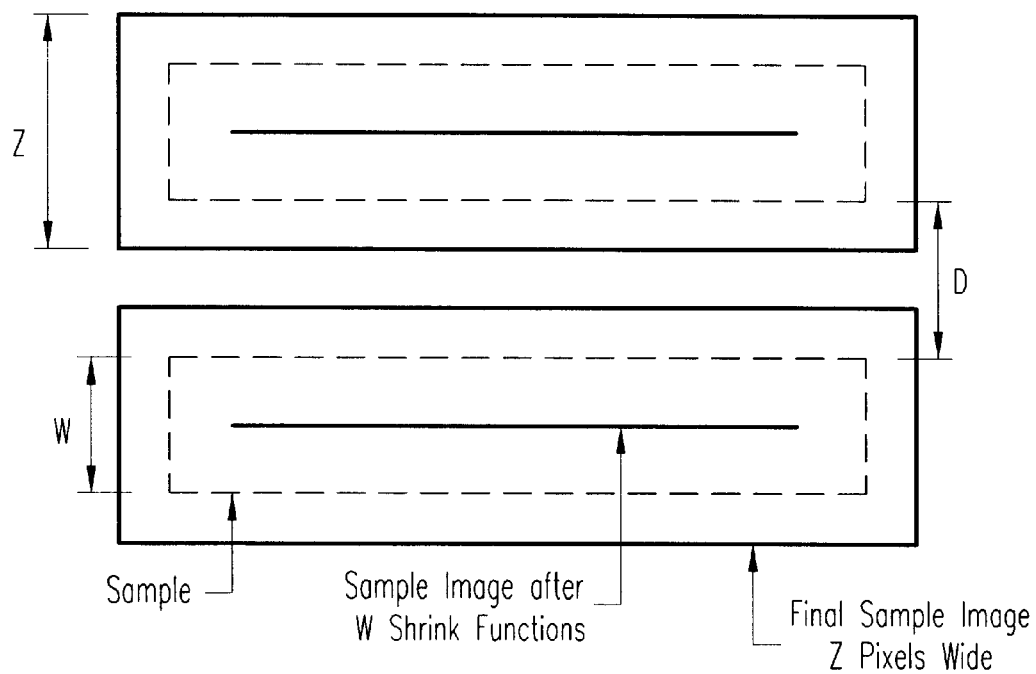
FIG. 16: Expand Functions Used for Programmable Alignment Tolerance
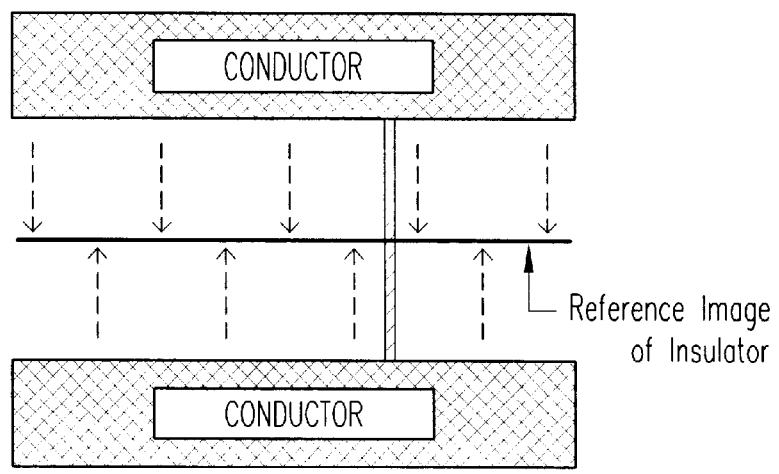
FIG. 17: Thinned Reference Image for Insulator

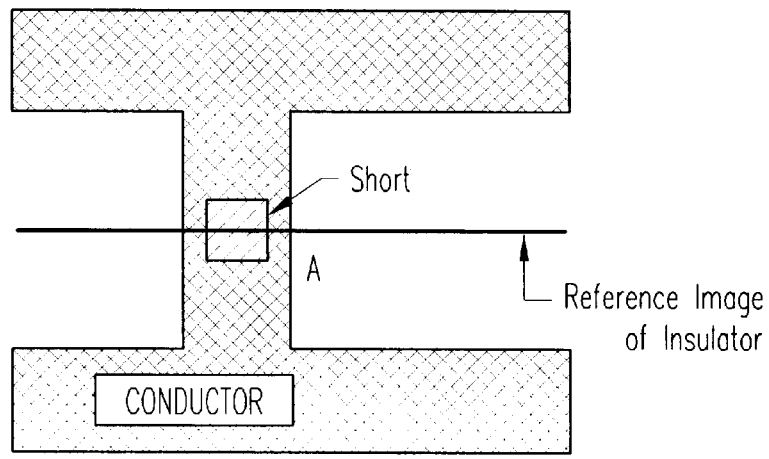
FIG. 18: Comparison of Thinned Insulator Reference Image to Sample with Small Short
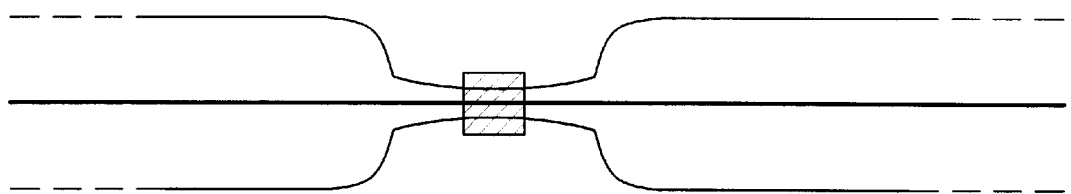
FIG. 19: Defect That Does Not Affect Connectivity

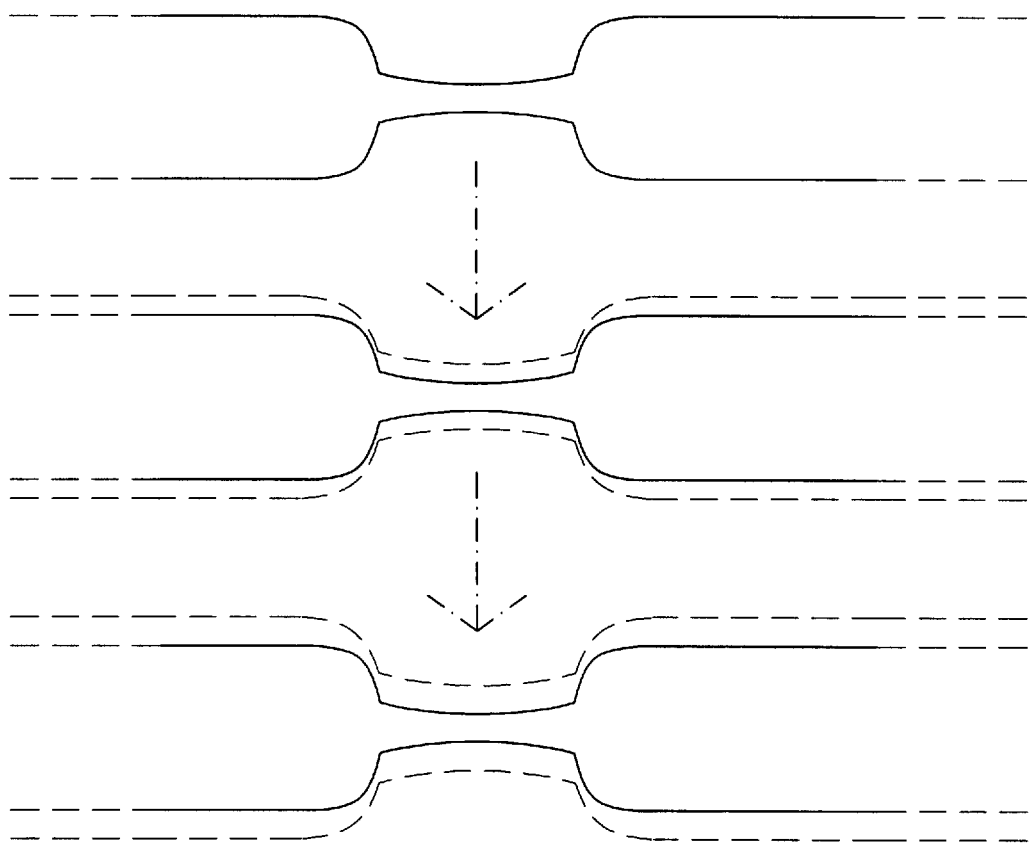
FIG. 20: Stages of Design Rule Inspection
Finding Thin Line
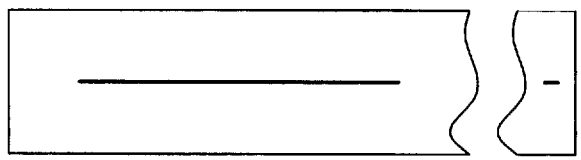
FIG. 21: Break Near the End of a Line

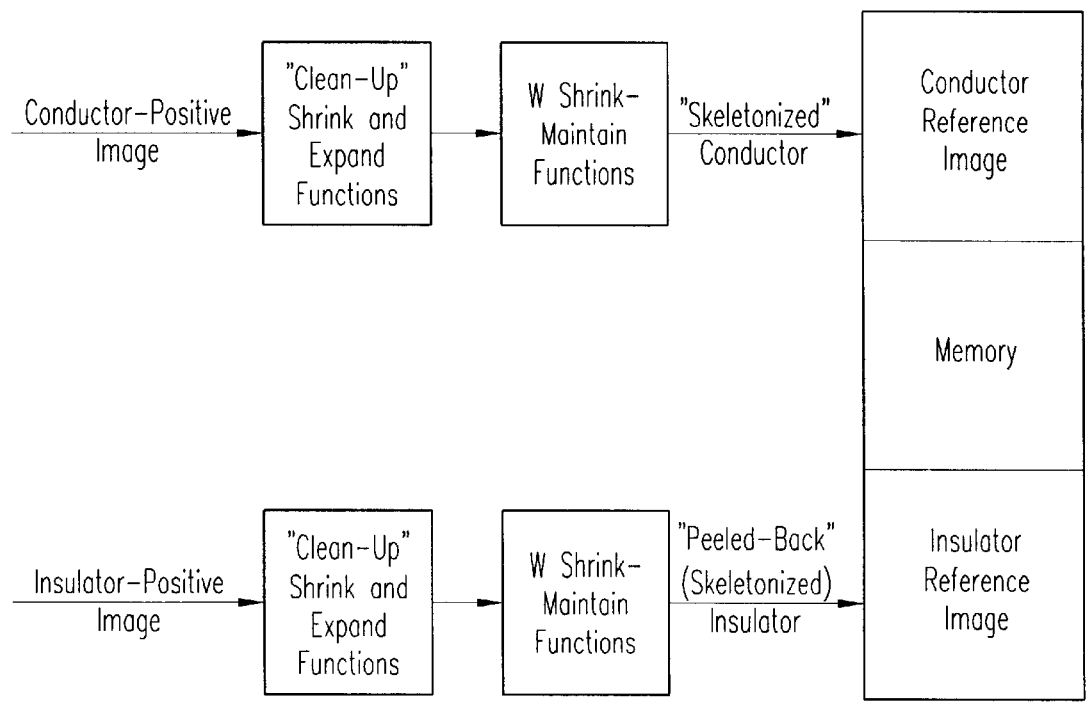
FIG. 22: Block Diagram for Reference Learning Process

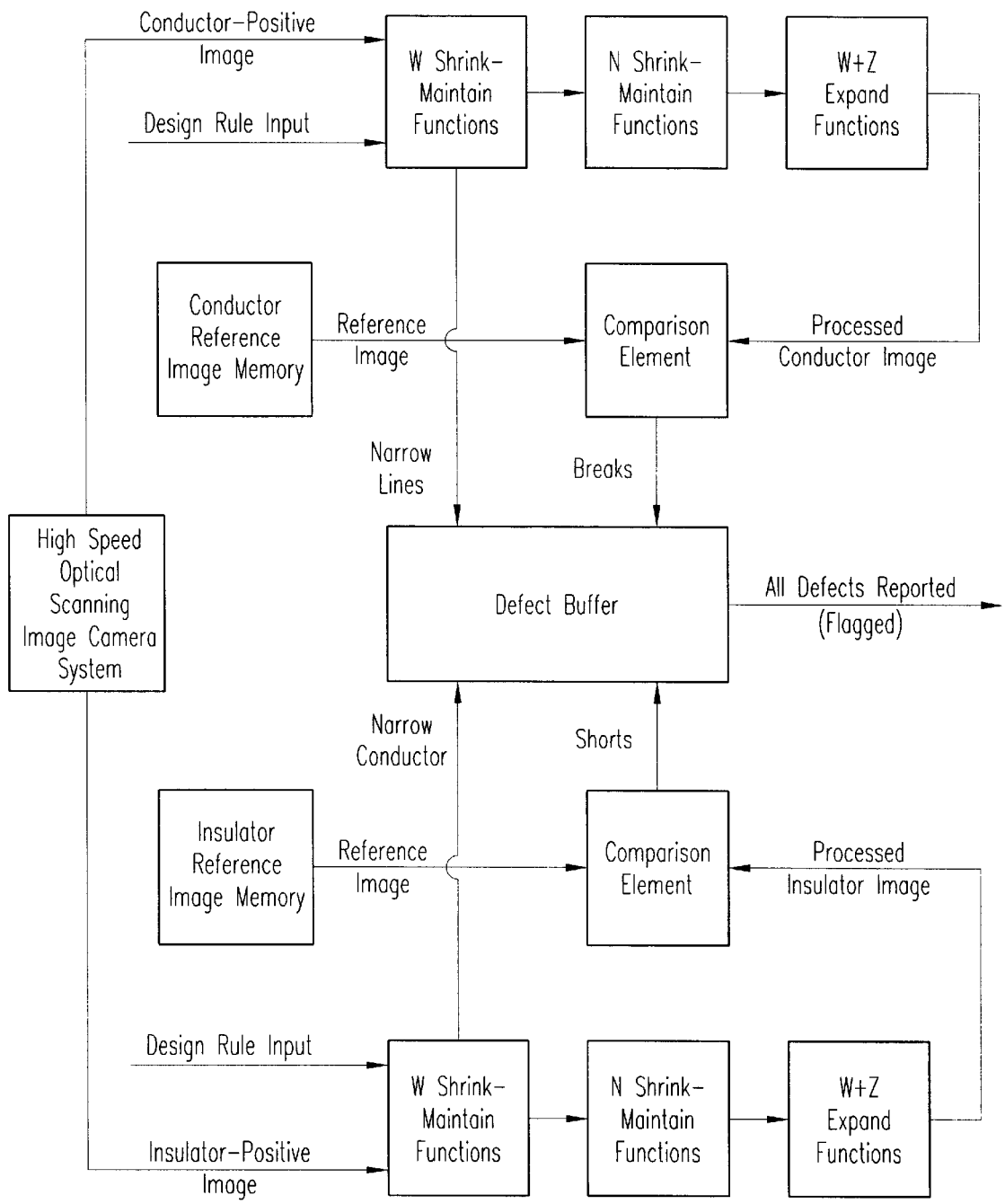
FIG. 23: Block Diagram for Full Inspection

APPARATUS FOR AND METHOD OF AUTOMATIC OPTICAL INSPECTION OF ELECTRONIC CIRCUIT BOARDS, WAFERS AND THE LIKE FOR DEFECTS, USING SKELETAL REFERENCE INSPECTION AND SEPARATELY PROGRAMMABLE ALIGNMENT TOLERANCE AND DETECTION PARAMETERS

The present invention relates to automatic optical inspection apparatus and techniques for scanning surfaces to detect defects in manufacture, particularly though not exclusively useful for the inspection of multi-layer semiconductor devices and the like, such as wafers, chips, circuit boards, etc., wherein metal conductor patterns are provided on non-metal or insulative surfaces. Current methods using reference comparison inspection have specific shortcomings that cause them to miss certain identifiable classes of defects. The new method of reference comparison of the present invention is directed to avoiding these shortcomings and therefore now enabling the reliable finding of all defects.

BACKGROUND

One method of prior reference inspection stores a correct image of the part and compares each inspected sample part to this reference image. To avoid missing all defects in the sample, however, requires very precise alignment of the sample and reference images, which demands perfect overlap. Commercial mechanical stage systems simplify cannot provide such accuracy; and even to approach that level of precision, becomes prohibitively expensive.

To eliminate this problem, the system may compare small areas, or elements, of the images. Unfortunately, this method fails due to the tradeoff between alignment accuracy and minimum defect size. As the defects grow smaller, the alignment tolerance decreases as well.

Another method of reference comparison stores a record of major features of the part, such as line ends and T intersections. This end/T-storage method also inspects by searching small areas, but it can detect small breaks that the first method cannot.

Neither of the above-described methods, furthermore, can reliably find incomplete breaks, or "mousebites".

In accordance with the new technique of the present invention, for the first time, it is believed, all defects, including those undetectable with prior inspection methods, can now be reliably and consistently detected. While also using the principle of reference comparison inspection, the invention introduces novel conditioning or processing of the reference image and conditioning or processing of the sample image, which, together with a standard design-rule inspection, now achieves a new and more reliable inspection system.

OBJECTS OF INVENTION

An object of the present invention, accordingly, is to provide a new and improved method of and apparatus for automatically optically inspecting for defects, electronic parts, such as wafers, chips, circuit boards and the like, comprising metal conductor and non-metal surfaces portions, and that, while using reference comparison as part of its technique, is not subject to the above-described and other limitations of prior art inspection techniques.

A further object is to provide such a novel technique wherein all manufacturing or other defects can now be reliably and consistently detected and flagged.

Still another object is to provide a novel inspection methodology more generally useful for all kinds of different-material surfaces and the like.

Other and further objects will be explained hereinafter and are more fully delineated in the appended claims.

SUMMARY

In summary, however, from one of its important and novel aspects, the invention embraces in the optical automatic high speed scanning inspection of electronic part samples and the like comprised of conductor patterns on insulator surfaces, and wherein defects in the conductor/insulator, including very small and/or irregular shape breaks in the conductor down to the order of one pixel may be present, and are to be detected by comparison with a reference part, a method of inspection, that comprises, producing scanned images of the sample and reference parts; conditioning the reference image by shrinking it to a one-pixel thin line to serve as a skeletonized reference image; conditioning the sample image through processing it by first shrinking it from W pixels wide to a one-pixel thin line; further processing by shrinking the length of the sample-image one-pixel thin line, N pixel shrinks, while maintaining connectivity of the line pixels; and completing the processing by expanding the shrink sample line image by W pixels, thereby effecting amplified and regularized-shape break defects N pixels in length in a sample image W pixels wide; and comparing the processed sample image to the skeletonized reference line image, with an alignment tolerance of W/2, to find non-corresponding points.

Preferred and best mode embodiments and techniques are later explained in detail.

DRAWINGS

The invention will now be explained in connection with the accompanying drawings.

FIG. 1 of which is a schematic outline diagram representative of images obtained by scanning optical inspection apparatus of well-known types, including of the type disclosed in my later-referenced earlier patent, of a "good" or reference surface or part (solid lines) and the corresponding surface or part of the sample under inspection (dotted lines) for alignment and reference comparison;

FIG. 3 shows the sample image as having a small break defect;

Figure 10A:
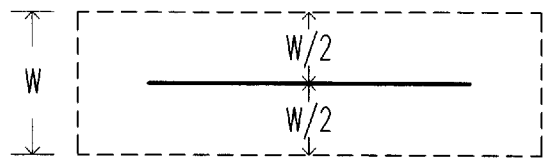
Figure 10B:
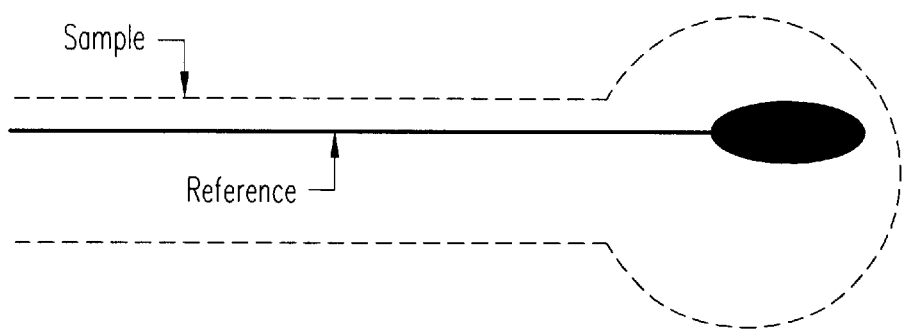

FIGS. 4(a) and (b) show end and T junction match (end/T match) comparison to the reference image of the sample of FIG. 3 with its small break defect, FIGS. 5(a) and (c) show an exemplary multiple element reference part and a defective sample part, showing in FIG. 5(e) the failure of end/T match comparison (FIG. 5(b) showing the reference ends and FIG. 5(d), the sample ends) to detect the sample defect;

FIG. 6 illustrates typical irregular defects that may also not be detected by end/T match techniques;

FIG. 7 similarly illustrates the problem in detecting "mousebite" shaped defects;

FIG. 8 shows the shrink-maintain single-pixel skeletonizing of the reference image in accordance with the invention;

FIGS. 9(a)–(c) diagrammatically show an expansion technique (FIG. 9(b)) prior to the shrinking (FIG. 9(c)) effectively to close small breaks;

FIGS. 10(a) and (b) show comparison of the skeletonized or thinned reference image of the type before discussed in connection with FIG. 8, and sample image with a W/4 width shift in both X and Y axis, FIG. 10(b);

FIG. 11 is a similar diagram illustrating the failure of such thinned reference comparison to find a very small break defect;

FIG. 12 shows the first "conditioning" step for the sample image, shrinking it by W pixels, (W/2 pixels from each edge), with FIG. 13 illustrating shrinking by W+N pixels; [(W+N)/2] pixels from each edge;

FIG. 14 shows the sample image after the W+N shrink functions of FIG. 13 and further W expand functions to amplify or accentuate a break N pixels wide, by adding N pixels to the original width of the break.

FIG. 15 shows comparison of the conditioned sample image of FIG. 14 with the skeletonized or thinned reference image;

FIG. 16 illustrates expanding the sample image by Z pixels for alignment tolerance selection;

FIG. 17 is a diagram illustrating the skeletonizing or thinning conditioning of the reference image of the insulator between conductor lines in the sample;

FIG. 18 shows the comparison of the thinned insulator reference image of FIG. 17 with a sample image containing a short defect;

FIG. 19 addresses a defect in the form of the thinned or narrowed conductor section;

FIG. 20 shows the application of design-rule shrinking for the type of defect of FIG. 19 and insuring its detection;

FIG. 21 is a similar diagram of still a further type of a broken-off end or near-end of the conductor line;

FIG. 22 is a block schematic diagram of the system of the invention configured to prepare and store cleaned up and skeletonized conductor and insulator reference images for memory storage in the reference learning process; and FIG. 23 is a preferred, all-defect, full inspection system block diagram of the invention.

PREFERRED EMBODIMENT(S) OF THE INVENTION

Before proceeding to describe preferred forms of the apparatus and method underlying the invention, and further to contrast the invention from pattern recognition and comparison systems of the prior art, earlier described, it is believed useful to illustrate the previously explained defect inspection limitations of such prior approaches.

Figure 1:
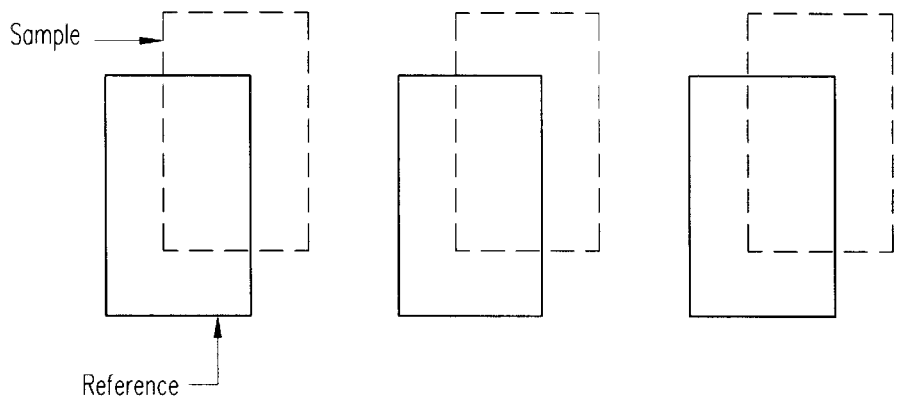

First, in connection with the before-mentioned prior comparison of the inspected sample part to the reference image, reference is made to FIG. 1, illustrating that the first obvious problem encountered is one of basic alignment. The solid line shows the stored reference image, while the dotted line shows the inspection image. Since, as shown, the reference image matches exactly the sample image, the two must overlap perfectly for a successful inspection—a task not easily accomplished. Historically, the optical image of a part of a sample-to-be-inspected, or a computer cad generated image of the part, is loaded into a computer or reference memory and hopefully optically aligned to a stored reference image (a "good" part), and the two are compared on a point-by-point basis, looking for differences which are usually either due to process variations in the manufacture of the sample, or more importantly, to a defect. Proper optical alignment becomes very difficult, particularly as part element geometries become smaller and smaller in the micron range. In high speed automated scanning inspection machines, the practice is to place the sample circuit board or wafer or the like on some kind of high speed scanning mechanical stage, and try to maintain proper reference alignment within microns, hopefully to compare the two parts, on a pixel-by-pixel basis.

In actual practice; during normal inspection operation, the patterns become shifted, as shown in FIG. 1, requiring the provision of some means of comparing these two images without flagging the shift as an error or defect.

Figure 2:
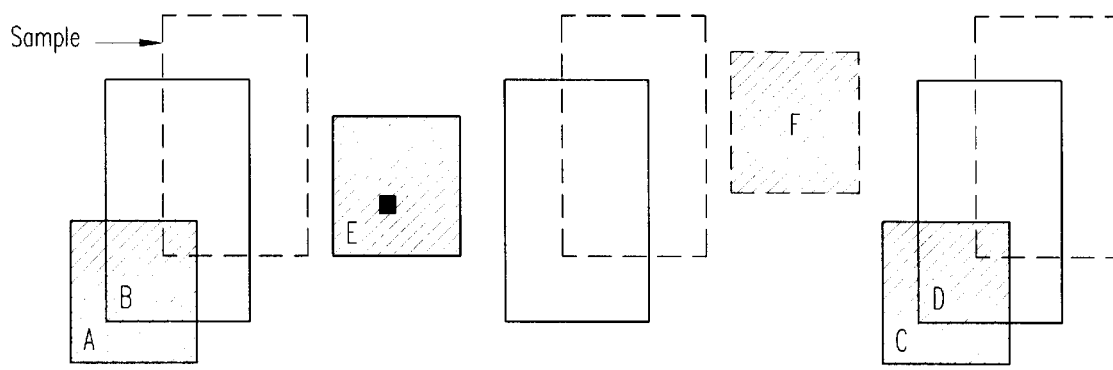
FIG. 2 is a similar diagram correlating elements of the images that are compared.

One common approach has been to create some form of acceptance area; that is, to postulate that a given point in the reference image must agree with a similar point in the sample image over a known limited or tolerance region. FIG. 2 shows point A, for example, with a rectangular search region around it. If point B in the sample image lies within that search region of point A of the stored reference, the two are said to agree. The concept of generating or creating a neighborhood limited search or tolerance region around each pixel for the purpose of searching for the corresponding matching point in the sample thus, one way to get around problems of certain types of misalignment. With such resort to limiting the comparison to small areas, or elements of the image, FIG. 2 demonstrates that even when the system finds corner B, for example, as a match for corner A, and likewise corner D for corner C, it can, however, find nothing similar in the sample for reference image feature E, in looking at the search region around E, and will thus classify such as an error or defect.

Not only is there a comparison of the reference image to the sample image, but there is also a comparison of the sample to the reference. For example, earlier it was observed that pixel E, present in the reference image, finds no neighboring pixel in the sample image and is thus missing therefrom. Correspondingly, the object indicated by F in the sample image, has no corresponding mate in the reference image. This is an extra feature defect in this sample, whereas point E is a missing feature defect.

Unfortunately, however, this technique often fails as a result of the tradeoff between alignment accuracy and minimum defect size, as earlier mentioned. As more particularly evident from FIGS. 3 and 4(a) and (b), the system can only find defects larger than the size of the search region. The system will not, for example, find a break B' in the sample image, because the element containing the break also contains pixels of the metal line on either side of the break. If one chooses an element small enough to find and flag the break as a defect, the element size is then too small to find corner C (FIG. 3) as a match for corner B. As earlier commented, indeed, as the defect grows smaller the dimension tolerance decreases as well.

This problem is exemplarily shown in FIG. 3 for a defect break in the sample image, which is not detected because the pixels of non-metal comprising the break in the sample shown in FIG. 3, happen to find corresponding non-metal pixels in the search region A of the reference image. Thus, where there is conductor metal in the reference, then within a certain tolerance region around that metal point, metal must be found in the corresponding sample region. Likewise, if there is non-metal or insulator in the reference, then scanning a certain region around that point in the sample we must find an insulator point. FIG. 3, accordingly, shows two so-called neighborhood regions A and A'; one drawn around the break B', and one just to the right of the reference conductor line. For points that are very close to the edge of a line, its neighborhood will contain both metal and non-metal, and there is no way to distinguish this situation from the actual break which is shown at B'.

As for the before-described approach of storing a record of major features such as line ends and T intersections, FIG. 4(a) thus shows the reference image (solid line) and its ends $R_2$ $R_1$, which are stored; and the sample image, with a narrow break such as a crack in a conductor (dotted line) and its ends $S_2$ and $S_1$, which the system is to compare with the stored reference ends. FIG. 4(b) illustrates how the system finds the defect by comparing ends within small areas; ($R_2$, $S_2$, and $R_1$, $S_1$), but it cannot find ends to match with ends $S_3$ and $S_4$. The system identifies $S_3$ and $S_4$ as defects.

As a further illustration, FIGS. 5(a)–(c) show an instance of a break that the end/T-storage method cannot find. FIG. 5(a) shows the reference part, and FIG. 5(b) shows the corresponding stored ends $R_1$–$R_6$. FIG. 5(c) shows the same features on a sample part-to-be-inspected, on which there is a break as shown in FIG. 5(c); and FIG. 5(d) shows its corresponding ends $S_1$–$S_6$. FIG. 5(e) depicts the comparison of the sets of ends, including how the system can "match" both $S_7$ and $S_4$ to $R_4$ and both $S_8$ and $S_5$ to $R_5$. The end/T-match method fails. The end/T match method may also not detect complex or irregular defects, such as a ragged break or the misshaped pinhole illustrated in FIG. 6, because a shape recognizer must be created in advance for each defect pattern that is to be detected, and since defect shapes are random and unpredictable, it is not possible to create shape recognizers for all possible defect patterns. Such defects would not be detected.

In addition, as the complexity of circuits increases, the number of shape recognizers also increases making this approach unacceptable for complex circuits.

For the objective of the present invention, to provide a general universal machine suitable for all types of circuits and defects, the end/T match is not suitable, particularly since defects are random phenomena, and all possible shapes that there may be, cannot be predicted.

In connection with the inability of such earlier-described prior art to find incomplete breaks or ragged-shaped "mousebite" defects and the like. FIG. 7(a) shows the element-comparison method applied to inspecting a "mousebite." (Again, solid lines show the reference image, while dotted lines represent the sample image.) With the inspection element squarely inside the metal conductor feature on the reference image, the system searches the "mousebitten" section of the sample image for metal, which it can easily find, and the defect goes undetected. FIG. 7(b) shows the end/T-match method applied to a "mousebite". If the system categorizes the edges of the defect as ends, the defect will be found. If not, however, the defect will go undetected.

In FIGS. 7(a) and (b), moreover, the reference image contains either metal or non-metal in the corresponding sample defect neighborhood region, whereas the sample image, at this point, happens to have no metal in it, and yet it is not flagged as a defect. This illustrates that one cannot discriminate between a difference due to a spatial shift between reference and sample images, versus a difference due to an actual defect. The two cannot be discriminated, and with reference comparison by itself, certain defects will not be detected. The next question is, how much tolerance can be tolerated. The search area, indeed, must be such that if a line is missing, it does not pick up an adjacent line, and mistake it for the missing line; therefore, generally the maximum search area can be no bigger than the minimum space between two conductor lines.

The invention, as well now be explained, totally overcomes these considerations, enabling independent programming of a tolerance and still enabling the detection of small breaks or shorts that even may be as small as one pixel.

Turning, now, to the implementation of the novel techniques of the present invention, special conditioning of the reference image and special conditioning of the image of the sample being inspected are incorporated into the reference comparison function, which, in combination with standard design-rule inspection, achieves the improved defect detection results of the invention. The "conditioning", in both cases, involves shrinking correct images into single pixel-wide skeletal lines and employing intelligent expansion and processing, as well, using design-rule techniques of the type described in my earlier U.S. Pat. No. 5,119,434, entitled "Method of and Apparatus for Geometric Pattern Inspection Employing Intelligent Imaged-Pattern Shrinking, Expanding and Processing to Identify Predetermined Features and Tolerances."

To illustrate the methodology of the invention, the example of FIG. 8 will be used as an illustration.

The stored reference image is prepared, processed or conditioned by shrinking a correct image (dotted arrows) down to a one single-pixel width line. To do this, the system uses a "shrink-maintain" operation; that is, it maintains continuity, performing pixel-by-pixel shrinking, as taught in said patent. If, therefore, a feature has parts of differing widths, the thinner section will reach one-pixel width and remain there, while the thicker section continues shrinking more, to catch up. Very thick parts, moreover, need only be shrunk to a reasonable width as illustrated to the right in FIG. 8. The part used to make the reference image can even have small minor defects or irregularities such as small breaks or the like, FIG. 9(a) as an example. Before shrinking, the image to single-pixel width (FIG. 9(c)), the system can first expand the image (FIG. 9(b) over 9(a)) closing such small breaks ("clean-up"), as shown.

The system then compares this generated "cleaned-up," skeletonized reference to sample lines generated of width W pixels with an alignment tolerance of W/2, as shown in FIG. 10(a). FIG. 10(b) show, as an example, a sample with a W/4 shift in both X and Y directions. Each point in the conductor reference image must have a corresponding, matching point in the sample image. If it does not, the system classifies that point as a "missing conductor" defect.

Starting with the reference image, therefore, the same is shrunk uniformly from all sides (see dotted arrow), to create a skeleton or spine image indicated by a straight single pixel-wide line (actually with little dots across the line). This so-called skeleton image is created to serve as a processed or conditioned reference image. A search area, indicated as a rectangle of width W pixels is used to look specifically for only missing features in the sample image relative to the reference. Since the reference image has now been reduced to a spine, the sample image can be shifted over the entire width of the line. This approach, however, has a limitation in that the system will miss very small breaks in the sample image that are smaller than the search area. For an inspection search area two pixels square, for example, one pixel breaks will be missed because the search area still contains metal next to the break.

FIG. 11 shows a sample image line with a break, which is to be detected within the rectangle search area. Metal, indeed, is present, but any small breaks (less in this case than the width of the search area), would be missed. In accordance with the invention, accordingly, instead of comparing the reference skeleton image with the sample image, the sample image is also processed or conditioned in such a way as to enable detection of a small break; namely, by shrinking the sample image initially W pixels; again into a skeleton single pixel-wide line, as shown in FIG. 12. The method of the invention, however, uses intelligence to maintain connectivity during sample image shrinking—all points that were connected must stay connected, and a line is not allowed to vanish. The remaining single pixel wide line, of FIG. 12 is now continued to be shrunk, but now from its end only. After W+N shrinks, the conditioned sample image of FIG. 13 is attained. Following this shrunk conditioning, the shrunk sample image is then expanded (in this example, W pixels) as shown in FIG. 14, ending up with conditioned pseudo sample image. Now, the break has been increased by N pixels; i.e. the original one pixel break has been effectively amplified to be N pixels big. The value of N, of course, can be fully programmable.

The comparison of the processed sample image and the conditioned reference image may now proceed. While, as earlier noted in connection with FIG. 11, where comparison of the reference image to the original unprocessed sample image was not able to detect the break because in the search region both metal and no-metal is seen in the search region, the technique of FIG. 15 wherein the thinned reference and processed sample images are compared, enables the amplified break now to be detectable. To solve all problems thus, the system of the invention, in addition to conditioning the reference image, also may condition the sample image, as previously stated.

To recapitulate, briefly, continuing to shrink the sample image, once it is reduced to a skeleton, by a greater amount than it is subsequently widened, amplifies small breaks on the sample otherwise undetectable. The sample image, however, must remain wider than the reference image, as a sample line width W gives an alignment tolerance of W/2. Width lost by shrinkage, therefore, must then be recovered by expansion.

The system in accordance with the invention, begins with the sample image in FIG. 11, a line of width W pixels with an exemplary irregular one-pixel break, and then shrinks this line by W pixels. FIG. 12 shows the result—a one-pixel width line with a W-pixel length break. Next, it shrinks this line by N more pixels. FIG. 13 shows the line, still one pixel in width since the shrink operations maintain continuity or connectivity, but with a break now W+N pixels in length. Finally, the system expands the line by W pixels, resulting in a line of width W pixels with a regular N-pixel length break (FIG. 14). Through this operation, the selected value of N determines the smallest findable defect, as shown in FIG. 15, comparing a skeletal reference line to the processed sample in FIGS. 11–14. The one-pixel break, increased by N pixels, is thus easy to find with an inspection search area N or fewer pixels square.

Additionally, in accordance with the invention, the alignment tolerance can be independently selected. Consider, for example, the case of two lines separated by a distance D, FIG. 16. After shrinking the line sample images W+N pixels, the system can expand and image by Z pixels, instead of W, where Z>W. The resulting alignment tolerance is Z/2 (FIG. 16). Z is constrained by W and the distance D between lines. To keep the expanded lines from merging, Z is chosen such that Z<W+D. One-pixel defects, such as the break in FIG. 13, after such shrinking and expanding, will appear W+N−Z pixels in length. That is,

[(Total pixel shrinkage)−(Total pixel expansion)]=(Resulting size of one-pixel defects).

The previous paragraphs all deal specifically with finding breaks by treating the metal lines as objects for comparison. Conversely, by treating the non-metal insulator between the lines as the object for comparison, the system can reliably find very small shorts (by missing insulator points). By first expanding the insulator image over small conductor shorts and then skeletonizing, or "peeling back" the insulator in the image, the system prepares a "cleaned-up", stored reference image for the insulator (FIG. 17), which is then compared to a sample image during inspection. If the sample image contains a short, as in FIG. 18, the comparison finds no insulator in that area (A), i.e. a gap in the insulator, and flags a defect. The system can amplify very small shorts or corresponding gaps in the insulator in a fashion similar to the before-described manner in which it deals with breaks in metal lines.

For the case of finding missing insulator portions, as when there may be extra metal or shorts, similarly a skeletonized image of the insulator may be stored. In such event, there are actually two memories that are needed, and they work independently in the present invention. One stores a skeletonized image of a non-conductor, and another stores a skeletonized image of the conductor. The conductor skeletonized reference enables looking for missing conductor—namely, a break; with the requirement that the skeleton be matched in the expanded sample image, enabling programmable tolerance to misalignment.

In order to find a short, the reference image of the insulator would again be skeletonized as shown in FIG. 17, which shows two conductors with a skeleton of an insulator between the two. FIG. 18 shows the comparison of the skeletonized insulator with the actual processed sample which contains a short, and therefore the exact duality to the process previously described, applies here, also. The short is detected as missing insulator.

Unique to the present invention, accordingly, is the use of the two memories; one storing a skeletonized image of the reference, and one independently storing a skeletonized image of the insulator, wherein the insulator is first shrunk into a single skeleton during the learn process, and independently and simultaneously, the metal is shrunk to a skeleton image. Both the insulator and the metal images are then expanded, but they can be expanded differently—different tolerances for different defects, as desired. The invention also provides for separately looking for extra and missing features. For example, in some applications, conductive mesh is used as a ground plane, and isolated areas are required in the mesh. Frequently, there is no concern if there is a small break, because the mesh is connected all over; but a short could be detrimental between, for example, an isolated pad. This requires looking for shorts, but not opens or breaks. This architecture of the invention enables the independent detection of shorts and opens. Breaks are detected as missing conductor, and shorts by missing insulator, with respect to their corresponding references, where each reference is a connectivity-maintained skeleton. Defects that do not violate connectivity, however, cannot be so detected.

The system of the invention, furthermore, can perform both a conductor and an insulator reference comparison at one time by storing both sets of information at once in its reference memory. It processes the two images, conductor-positive and insulator-positive, independently and in parallel, storing them simultaneously when creating a reference image (learning), and comparing them to their stored counterparts simultaneously when performing an inspection.

The selection of the number of expands after shrinking thus, in accordance with the invention, determines the spatial (alignment) tolerance. The number of shrinks selected after the line has been reduced to a single pixel wide line, represents the degree of amplifying of small breaks in the conductor image and small shorts in the insulator image. The invention thus provides a novel independent control over both parameters; independently controlling the tolerance to misalignment and increasing such tolerance while still detecting a break or short as small as one pixel in a line or space.

Some defects do not change connectivity, such as the "mousebite" mentioned above. Some of these, like the thinned line shown in FIG. 19, will not flag as defects in prior art reference comparison schemes such as the one above outlined. By incorporating a design-rule inspection, as before mentioned, carried out simultaneously for permissible and non-allowable parameters, such as line widths and the like, such defects will be caught. This design-rule inspection programming also uses the shrinking function, as taught in my said earlier patent, to narrow the lines by their minimum permissible or allowable design-rule width or spacing, etc., as shown in the successive steps of FIG. 20, and flags as defects any lines that do not meet that constraint. It also works in parallel on conductor and insulator.

FIG. 21 illustrates another particular defect that is normally also difficult to find; namely, a break very near the end of a line. The little broken-off end of the line, however, will not shrink away and disappear, since the shrink function will not let a single-pixel feature disappear. The piece will shrink to one pixel and then expand again, so that the system will find the break.

To detect these defects, the same earlier described design rule processors that are used for shrinking and creation of the skeleton reference image, and for expansion and processing of the sample image, can also be used to do the design rule analysis. As shown, FIG. 20 is a series of shrink processors, with each stage sequentially eliminating one row of pixels from the perimeter. Each unit can be programmed with simple instructions either to shrink or expand while maintaining connectivity, to flag a thin pixel line. Once flagged as a defect, it is marked as such. The shrinkage continues to a single pixel, and can then start expanding the line during inspection, or maintaining the skeleton image during the creation of the learn set. Because of the intelligence that the shrink/expand units perform, they can thus also be programmed to flag individually isolated pixels (features).

By using supplemental design rule processing, therefore, small defects at the end of the line (FIG. 21), any narrowing of the line (FIGS. 19 and 20) and any other design rule defects may be checked with respect to a true reference image, still being able to find small breaks, opens, and any change of connectivity, while still tolerating alignment misalignments; and, because the amount of expansion or contraction can be programmed to determine how narrow a line is, before being flagged as a defect. This latter feature enables the invention to program manufacturing process tolerances to the machine—a result heretofore largely unattainable with reference comparison systems of the prior art which are unable to deal with such process variation.

When looking for very small defects and very small differences, the need for very accurate alignment is essential. But the price paid for, is the picking up of all variations in the manufacturing process, since a true reference comparison system cannot determine the difference between a process variation and a real defect. With the present invention, on the other hand, by using intelligence, allowable width process variations in the line are programmed, while still maintaining the circuit connectivity of a "good circuit".

FIG. 22 presents a block circuit-function diagram of the system of the invention configured to prepare and store two reference images; one, a conductor reference image, and the other, an insulator reference image. This learning process consists of expand functions for "clean-up", as before described, followed by shrink functions for "skeletonization", operating on bits representing conductor and on bits representing insulator. After these images are stored, the system can perform an inspection, which requires slight reconfiguration for the operation of the four following simultaneous inspections: reference comparison of conductor material, reference comparison of insulator material, design rule check of conductor material, and design rule check of insulator material. As shown in FIG. 23, the system first flags design rule violations and then further processes the sample image, using shrink and expand functions, for comparison with the stored reference image. Finally, the system reports defects flagged by either process together at the end of the inspection.

Specifically, the conductor-positive image is conditioned by W shrink-maintain functions, (i.e. shrink but maintain connectivity as before described), then N shrink—maintain functions, and then W+Z expand functions, feeding the processed conductor (metal) image to the upper "Comparison Element" or image comparator shown in FIG. 23. The comparison is with a reference image provided from storage in memory. Narrow line and break defects are detected in the buffer, so-labeled, and reported.

In a parallel manner, the insulator-positive image is subjected to W shrink-maintain, N shrink-maintain and W+Z expand functions, applying the processed non-conductor insulator image to the lower "Comparison Element" in FIG. 23, for comparison with an insulator reference image from memory. Narrow conductor and short defects are flagged for the defect buffer to report.

In this manner, defects, including those undetectable by prior systems, as before explained, are now reliably detected.

An alternate configuration, is the comparison of a "skeletonized" sample image to a conditioned, width-W reference image, which requires the following changes. The system prepares the reference image, performing the "clean-up" functions and shrinking or expanding to the desired width, and then saves it. The system prepares the sample image in much the same way previously described leaving out the expand functions; instead, it shrinks the sample image completely to a skeleton. In the comparison previously described, each point in the reference image must have a matching point in the sample image; in other words, each conductor point in the "skeletonized" conductor-positive reference image must have a matching point in the conductor-positive sample image, and similarly for the "skeletonized" insulator-positive images. In this alternate configuration, each conductor point in the "skeletonized" conductor-positive sample image must have a matching point in the conductor-positive reference image, and each insulator point in the "skeletonized" insulator-positive sample image must have a matching point in the insulator-positive reference image.

While the invention has been described in connection with different materials, metal conductors and insulator backgrounds, where it has particularly important application, clearly the technique hereof is more general and is also adaptable to other pairs or pluralities of different optically contrasting material composites, as well.

Further modifications will also occur to those skilled in this art, and such are considered to fall within the spirit and scope of the invention as defined in the appended claims.

What is claimed is:

1. In the optical automatic high speed scanning inspection of electronic part samples and the like comprised of conductor patterns on insulator surfaces, and wherein defects in the conductor and/or insulator, including very small and/or irregular shape breaks down to the order of one pixel in the conductor may be present, and are to be detected by comparison with a reference part, a method of inspection, that comprises, producing scanned images of the sample and reference parts; conditioning the reference image by shrinking it to a one-pixel thin line to serve as a skeletonized reference image; conditioning the sample image through processing it by first shrinking it from W pixels wide to a one-pixel thin line; further processing by shrinking the length of the sample-image one-pixel thin line, N pixel shrinks, while maintaining connectivity of the line pixels; and completing the processing by expanding the shrunk sample line image by W pixels, thereby effecting amplified and regularized-shape break defects N pixels in length in a sample image W pixels wide; and comparing the processed sample image to the skeletonized reference line image, with an alignment tolerance of W/2, to find non-corresponding points.

2. The method of claim 1 wherein the conductor lines are used as the objects for comparison of reference and sample images.

3. The method of claim 1 wherein the value of N is selected to determine the smallest desired findable defect in the inspection.

4. The method of claim 2 wherein design-rule programming is also simultaneously used to supplement said inspection on matters such as possible line widths and the like.

5. In the optical automatic high speed scanning inspection of electronic part samples and the like comprised of conductor patterns on insulator surfaces, and wherein defects in the conductor and/or insulator, including very small and/or irregular-shape breaks down to the order of one pixel in the conductor may be present, and are to be detected by comparison with a reference part, a method of inspection, that comprises, producing scanned images of the sample and reference part; conditioning the reference image by shrinking it from W pixels wide to a one-pixel thin line to serve as a skeltonized reference image; conditioning the sample image through processing it by first shrinking it from W pixels wide to a one-pixel thin line; further processing by shrinking the length of the sample-image, one-pixel thin line, N pixel shrinks, while maintaining connectivity of the line pixels; and completing the processing by expanding the shrunk sample line image by Z pixels, where Z>W, thereby effecting not only amplified and regularized-shape break defect images W+N−Z pixels in length, but also independently providing a resulting alignment tolerance of Z/2; and comparing the processed sample image to the skeletonized reference line image to find non-corresponding points.

6. The method of claim 5 wherein, for adjacent sample image lines of separation D, Z is selected such that D>Z−W to keep expanded lines from merging.

7. In the optical automatic high speed scanning inspection of electronic part samples and the like comprised of conductor patterns on insulator surfaces, and wherein defects in the conductor and/or insulator, including very small and/or irregular shape shorts between conductor lines or gaps in insulator area to the center of one pixel may be present, and are to be detected by comparison with a reference part, a method of inspection, that comprises, producing scanned images of the sample and reference parts; conditioning the reference image by shrinking it from W pixels wide to one-pixel thin line to serve as a skeletonized reference image; conditioning the sample image through processing it by first shrinking it from W pixels wide to a one-pixel thin line; further processing by shrinking the length of the sample-image, one-pixel thin line, N pixel shrinks, while maintaining connectivity of the line pixels; and completing the processing by expanding the shrunk sample line image by W pixels, thereby effecting amplified and regularized-shape short defect images N pixels in length corresponding to missing insulator points; and comparing the processed sample image to the skeletonized reference line image, with an alignment tolerance of W/2, to find non-corresponding points.

8. The method of claim 7 wherein the insulator areas are used as the objects for comparison of reference and sample images.

9. The method of claim 7 wherein the value of N is selected to determine the smallest desired findable defect in the inspection.

10. The method of claim 8 wherein design-rule programming is also simultaneously used to supplement said inspection on matters such as permissible line/insulator spacings and the like.

11. In the optical automatic scanning high speed inspection of electronic part samples and the like comprised of conductor patterns on insulator surfaces, and wherein defects in the conductor and/or insulator, including very small and/or irregular-shape breaks in conductor and shorts between conductors corresponding to gaps in insulators, down to the order of one pixel may be present, and are to be detected by comparison with a reference part, a method of inspection, that comprises, producing images of the sample part conductor and insulator positive images of the reference part; conditioning each of the reference images by shrinking from W pixels wide to one-pixel thin line to serve as a skeletonized conductor and insulator reference images; conditioning the sample image through-processing it by first shrinking it from W pixels wide to a one-pixel thin line; further processing by shrinking the length of the sample-image, one-pixel thin line, N pixel shrinks, while maintaining connectivity of the line pixels; and completing the processing by expanding the shrunk sample line image by W pixels, thereby effecting not only amplified and regularized-shape breaks, shorts or missing insulator defects N pixels in length, providing a resulting alignment tolerance of W/2; and comparing the resulting processed sample image to the skeletonized reference line images to find non-corresponding points.

12. The method of claim 11 wherein the conductor lines and insulator areas are used in parallel as the objects for comparison of reference and sample images.

13. The method of claim 12 wherein the value of N is selected to determine the smallest desired findable defects in the inspection.

14. The method of claim 12 wherein design-rule programming is also simultaneously used to supplement said inspection on matters such as permissible line widths, spacing and the like.

15. The method of claim 12 wherein, instead of expanding W pixels, the expansion is by Z pixels, where Z>W, thereby producing not only amplified and regularized break and short or insulator gap different images W+N−Z, in length, but also independently providing a desired resulting alignment tolerance of Z/2.

16. The method of claim 15 wherein, for adjacent sample image lines of separation D, Z is selected such that D>Z−W to keep expanded lines from merging and to set a selected alignment tolerance.

17. The method of claim 16 wherein Z is selected to have the same value when using both the conductor lines and the insulator areas as objects for the reference comparisons, thereby to produce the same alignment tolerance for each.

18. The method of claim 17 wherein Z is selected to have different values when using each of the conductor lines and the insulator areas as objects for the reference comparisons, thereby to provide different alignment tolerances for each.

19. The method as claimed in claim 14 wherein, in the reference image learning process for creating reference images for storing in memory for later use in the reference comparison in the inspection process of sample images, both conductor and insulator positive images are provided, being first expanded to clean up imperfections, and then being shrunk W pixels while maintaining pixel line connectivity, to create, respectively, a skeletonized conductor reference image and a skeletonized "peeled-back" insulator reference image; and storing the skeletonized images in parallel in memory.

20. The method of claim 19 wherein, during said inspection process of the sample images, the stored skeletonized conductor and insulator reference images are fed to respective comparison elements to be compared therein; with the sample images respectively processed, and in parallel, by respective W pixel shrinking of each of the conductor and insulator positive images while maintaining pixel line connectivity, followed by N pixel expansion and then one of W and W+Z expansion functions, where Z>W.

21. The method of claim 20 wherein, from the respective comparison elements, comparison break and short defect information is fed to a buffer detector for defect reporting, and from the respective W pixel shrinking functions, together with design rule processing information, narrow line and conductor defect information is also fed to the defect buffer.

22. The method as claimed in claim 4 wherein, in the reference image learning process for creating reference images for storing in memory for later use in reference comparison in the inspection process of sample images, a positive reference conductor image is provided and is first expanded to clean up imperfections, and then shrunk W pixels while maintaining pixel line connectivity, to create a skeletonized conductor reference image; and storing the skeletonized image in memory.

23. The method of claim 22 wherein, during said inspection process of the sample image, the stored skeletonized conductor reference image is fed to a comparison element to be compared therein with the sample image as processed by W pixel shrinking while maintaining pixel line connectivity, followed by N pixel expansion and then one of W and W+Z expansion functions, where Z>W.

24. The method of claim 23 wherein, from the comparison element, comparison break defect information is fed to a buffer detector for defect reporting, and from the W pixel shrinking, together with design rule processing information, narrow line defect information is also fed to the defect buffer.

25. The method as claimed in claim 8 wherein, in the reference image learning process for creating reference images for storing in memory for later use in reference comparison in the inspection process of sample images, a positive reference insulator image is provided and is first expanded to clean up imperfections, and then shrunk W pixels while maintaining pixel line connectivity, to create a skeletonized "peeled back" insulator reference image; and storing the skeletonized image in memory.

26. The method of claim 25 wherein, during said inspection process of the sample image, the stored skeletonized insulator reference image is fed to a comparison element to be compared therein with the sample image as processed by W pixel shrinking while maintaining pixel line connectivity, followed by N pixel expansion and then one of W and W+Z expansion functions, where Z>W.

27. The method of claim 26 wherein, from the comparison element, comparison short defect information is fed to a buffer detector for defect reporting, and from the W pixel shrinking, together with design rule processing information, narrow conductor defect information is also fed to the defect buffer.

28. A method of automatic high speed optical scanning inspection for defects in electronic parts samples comprising conductor patterns on insulator areas, that comprises, producing scanned images of the sample part and of a reference part for reference comparison inspection; processing the reference image to generate a one-pixel line width skeleton to serve as a processed reference image; processing the sample image by pixel shrink and expand functions to generate a processed sample image wider than the reference image; comparing the processed reference and sample images to detect missing points in the latter; flagging such missing points; and simultaneously using design rule programming to supplement said inspection for permissible parameters such as line widths wherein the reference image processing comprises expanding each of conductor-positive and insulator-positive images to dean up any minor irregularities therein, and shrinking the images to clean up any minor irregularities therein, and shrinking the images into one-pixel skeleton conductor and insulation image lines, and storing the same in memory for use in reference comparison inspection of the sample images, and wherein the sample image processing comprises shrinking each of conductor-positive and insulator-positive images thereof W pixels to generate one-pixel wide skeleton line images with maintaining pixel connectivity, and then continuing the shrinking of the length of the lines N pixels while maintaining connectivity, and then expanding the shrunk images at least W pixels to create the processed conductor and insulator sample images for comparison inspection with the reference images.

29. The method of claim 28 wherein the expanding of the shrunk images is W+Z pixels, where Z>W, independently to permit increased alignment tolerance adjustment between the reference and sample images.

30. The method of claim 29 wherein, for adjacent sample image lines of separation D, Z is selected such that D>Z−W, to keep expanded lines from merging and to set a selected alignment tolerance.

31. The method of claim 29 wherein the value of N is selected to determine the smallest desired findable defect in the inspection.

32. The method of claim 28 wherein said inspection flags design rule violations and further processes the sample image, using shrink and expand functions for comparison with the stored reference images, to achieve four substantially simultaneous inspections; reference comparison of conductor materials; reference comparison of insulator material; design rule check of conductor material; and design rule check of insulator material.

33. The method of claim 32 wherein manufacturing process variations of the sample parts are also detected.

34. A method of automatic high speed optical scanning inspection for defects in sample articles comprising two optically contrasting different material patterns, that comprises, producing scanned images of a sample part and of a reference part for reference comparison inspection; processing the reference image to generate a one-pixel line width skeleton to serve as a processed reference image; processing the sample image by pixel shrink and expand functions to generate a processed sample image wider than the reference image; comparing the processed reference and sample images to detect missing points in the latter; flagging such missing points; and simultaneously using design rule programming to supplement said inspection for verifying predetermined parameters such as permissible dimensions or areas of materials, and wherein the reference image processing comprises expanding images of each of the material patterns to clean up any minor irregularities therein, and shrinking the images into one-pixel skeleton image lines, and storing the same in memory for use in reference comparison inspection of the sample images, wherein the sample image processing comprises shrinking images of each of the two optically contrasting material patterns in the sample W pixels to generate one pixel wide skeleton line images with maintained pixel connectivity, and then continuing the shrinking of the length of the lines N pixels while maintaining connectivity, and then expanding the shrunk images at least W pixels to create processed two material sample images for comparison inspection with the reference images.

35. The method of claim 34 wherein the expanding of the shrunk images is W+Z pixels, where Z>W, independently to permit increased alignment tolerance adjustment between the reference and sample images.

36. The method of claim 35 wherein, for adjacent sample image pattern lines of separation D, Z is selected such that D>Z-W, to keep expanded lines from merging and to set a selected alignment tolerance.

37. The method of claim 34 wherein the value of N is selected to determine the smallest desired findable defect in the inspection.

38. The method of claim 34 wherein said inspection flags design rule violations and further processes the sample image, using shrink and expand functions for comparison with the stored reference images, to achieve four substantially simultaneous inspections: reference comparison of one material; reference comparison of the other material; design rule check of one material; and design rule check of the other material.

39. The method of claim 38 wherein manufacturing process variations of the sample parts are also detected.

40. Apparatus for automatic high-speed optical scanning inspection for defects in electronic parts comprising conductor patterns on insulator areas having, in combination, imaging means for producing scanned images of the sample part and of a reference part for reference comparison inspection; means for processing the reference image to generate a one-pixel line width skeleton to serve as a processed reference image; means for processing the sample image by pixel shrink and expand functions to generate a processed sample image wider than the reference image; means for comparing the processed reference and sample images to detect missing points in the latter; means for flagging such detected missing points; and means comprising design rule programming for simultaneously supplementing said inspection for permissible parameters such as line widths, wherein the reference image processing means comprises means for expanding each of conductor-positive and insulator-positive images to clean up any minor irregularities therein, and means for shrinking the images into one-pixel skeleton conductor and insulation image lines, and means for storing the same in memory for use in subsequent reference comparison inspection of the sample images, and wherein the sample image processing means comprises means for shrinking each of conductor-positive and insulator-positive images thereof W pixels to generate one-pixel wide skeleton lines images while maintaining pixel connectivity, and then continuing the shrinking of the length of the lines N pixels while still maintaining connectivity; and means for then expanding the shrunk images at least W pixels to create the processed conductor and insulator sample images for comparison inspection with the reference images.

41. The apparatus of claim 40 wherein the expanding means expands the shrunk images W+Z pixels, where Z>W, independently to permit increased alignment tolerance adjustment between the reference and sample images.

42. The apparatus of claim 41 wherein, for adjacent sample image lines of separation D, Z is selected such that D>Z-W, to keep expanded lines from merging and to set a selected alignment tolerance.

43. The apparatus of claim 40 wherein the value of N is selected to determine the smallest desired findable defect in the inspection.

44. The apparatus of claim 40 wherein said inspection, means is provided to flag design rule violations cooperative with means for further processing the sample image, using shrink and expand functions for comparison with the stored reference images, to achieve four substantially simultaneous inspections: reference comparison of conductor material; reference comparison of insulator material; design rule check of conductor material; and design rule check of insulator material.

45. The apparatus of claim 44 wherein means is provided for also detecting manufacturing process variations of the sample parts.

46. The apparatus of claim 40 wherein separate comparison means are provided, one for comparing the processed conductor reference image and the processed sample conductor image, and another for comparing the processed insulator reference image and the processed sample insulator image.

47. The apparatus of claim 46 wherein the separate comparison means respectively feed defect break/narrow line detection and defect short and narrow conductor detection to a common buffer, and the buffer outputs said defects.

* * * * *